United States Patent
Lin

(10) Patent No.: US 7,803,006 B2
(45) Date of Patent: Sep. 28, 2010

(54) BURN-IN SOCKET WITH HARD STOPPER

(75) Inventor: Wei-Chih Lin, Tu-Cheng (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 12/471,498

(22) Filed: May 26, 2009

(65) Prior Publication Data

US 2009/0291582 A1 Nov. 26, 2009

(30) Foreign Application Priority Data

May 26, 2008 (TW) ................................ 097209119

(51) Int. Cl.
*H01R 13/62* (2006.01)
(52) U.S. Cl. ........................................ 439/331; 439/70
(58) Field of Classification Search ................. 439/331, 439/70
See application file for complete search history.

(56) References Cited

U.S. PATENT DOCUMENTS

| 7,666,016 | B2 * | 2/2010 | Kobayashi | 439/296 |
| 2007/0238327 | A1 * | 10/2007 | Hsu | 439/70 |
| 2008/0020623 | A1 * | 1/2008 | Wooden | 439/331 |
| 2008/0207037 | A1 * | 8/2008 | Barabi et al. | 439/331 |
| 2008/0280477 | A1 * | 11/2008 | Hsiao et al. | 439/331 |

FOREIGN PATENT DOCUMENTS

TW M324868 1/2008

* cited by examiner

*Primary Examiner*—Hien Vu
(74) *Attorney, Agent, or Firm*—Andrew C. Cheng; Wei Te Chung; Ming Chieh Chang

(57) ABSTRACT

A burn-in includes a base, a number of contacts received in the base, and a cover pivotally mounted to the base and rotatably moving between an open position and a closed position. The base defines a receiving space and a plurality of recesses adjacent to and communicating with the receiving space. Two hard stoppers are mounted to the recesses of the base and support upwardly the cover.

7 Claims, 4 Drawing Sheets

BURN-IN SOCKET WITH HARD STOPPER

BACKGROUND OF THE INVENTION

1. Field of the Invention

The present invention relates to a burn-in socket, and more particularly to a socket having a hard stopper disposed within a base for precisely controlling a stroke of a contact mounted in the base.

2. Description of the Prior Art

Electronic packages are installed in a printed circuit board to construct a complete circuit with continuous functions. To ensure the functionality and reliability of the electronic package during service life, the electronic package must be tested before actual field application. The electronic package in the test usually undergoes an extended period of time at a high temperature, so that any earlier failure of a package can be detected accordingly. A so-called burn-in socket servers for connecting the electronic package to a test printed circuit board.

Tai Wan Pat No. M324868, issued to Hsiao on Jan. 1, 2008, discloses a typical burn-in socket. The burn-in socket includes a socket body with a plurality of contacts disposed therein, a cover rotatably coupled to the socket body and at least one slider received in the socket body. The socket body defines a receiving space for receiving an IC (integrated circuit) package, and the cover has a driving member. The slider has an end engaging with the driving member and another end extending toward the receiving space. When the burn-in socket is in a closed position, the slider supports the IC package to keep a reliable connection between the burn-in socket and the IC package. The cover comprises a lid that is formed with a frame configuration, a pressing member assembled to a bottom of the lid and a metal fastener on a top of the cover. When the burn-in socket is in a closed position, the cover presses downwardly an upper surface of the IC package to make an electrical connection between the contacts and the IC package. On that condition, the stroke of the contact is related to the configuration of the cover. As the cover is an assembly, a composite tolerance is created between adjacent members of the cover. As we all known, the number of the assembled members is increased, the composite tolerance of the assembly is increased. Thus the length of the contact may be designed in a wide range for the cover may have a large tolerance. As a result, it's difficult to control the stroke of the contact, so we need to provide a new burn-in socket to overcome this question.

SUMMARY OF THE INVENTION

Accordingly, an object of the present invention is to provide a burn-in socket with a hard stopper disposed within a base for exactly controlling a stroke of contact mounted in the base.

In order to achieve the object set forth, a burn-in comprises a base defining a receiving space, a plurality of contacts received in the receiving space, and a cover pivotally mounted to the base and rotatably moving between an open position and a closed position relative to the base. At least one separated hard stopper is mounted to the recess of the base and supporting the cover.

In order to further achieve the object set forth, a burn-in socket comprises a base defining a receiving space, a plurality of contacts received in the receiving space of the base, and a cover pivotally mounted to the base and rotatably moving between an open position and a closed position. The cover has a pressing portion extending into the receiving space when the cover set in the closed position, the pressing portion has a plurality of protrusions extending therefrom. A separated hard stopper is mounted to the base adapted to load with the protrusion of the cover.

DESCRIPTION OF PREFERRED EMBODIMENT

Reference will now be made to the drawings to describe the present invention in detail.

Figure 1:
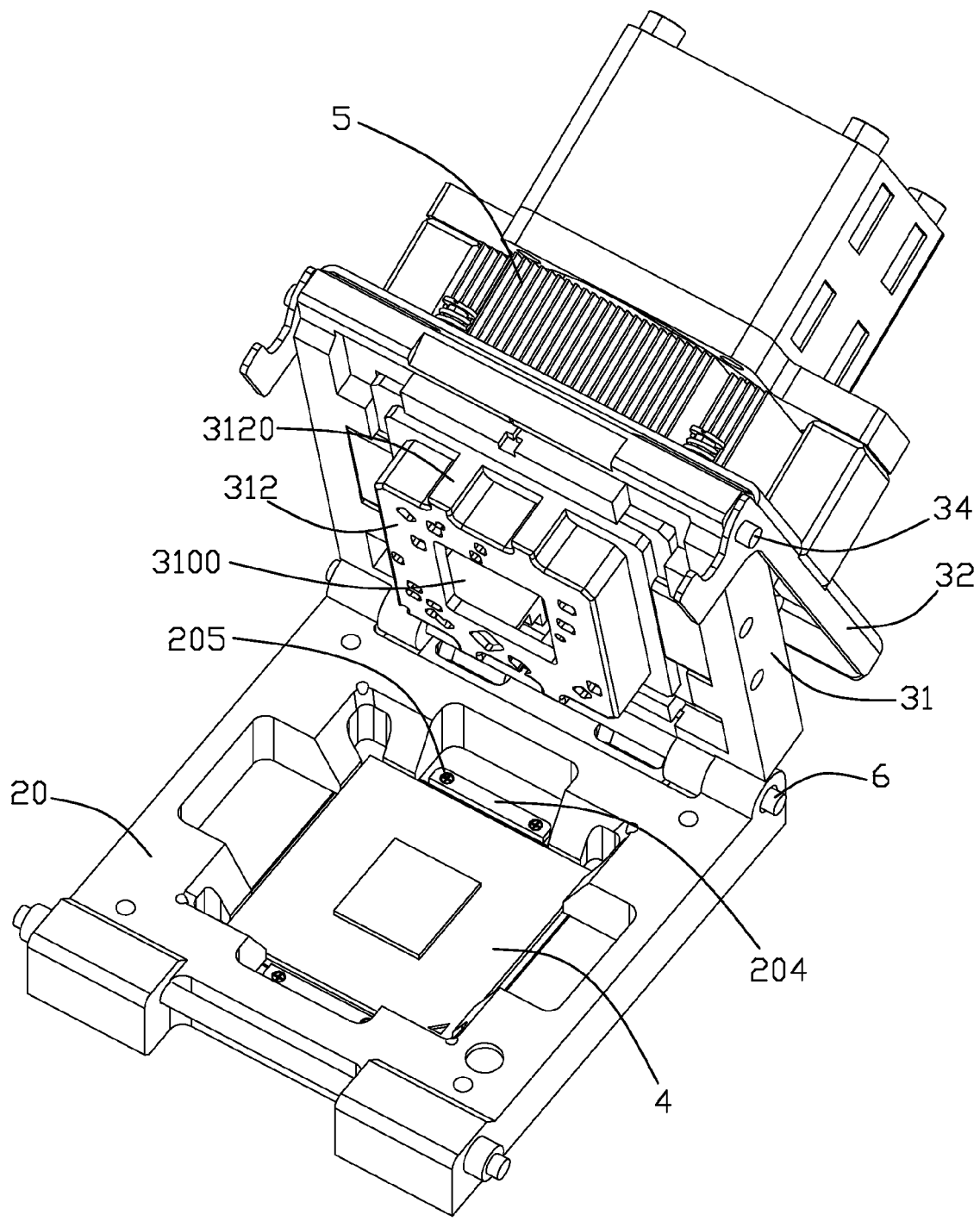
FIG. 1 is an assembled perspective view of a burn-in socket according to the present invention.

FIG. 1 shows a burn-in socket electrically connecting an IC package 4 with a printed circuit board (not shown) and used for testing the IC package 4. The burn-in socket comprises a base 2, a plurality of contacts 7 disposed in the base 2, a cover 3 pivotally mounted to the base 2 and rotating between an open position and a closed position relative to the base 2, and a heat sink 5 fixed to the cover 3.

Figure 3:
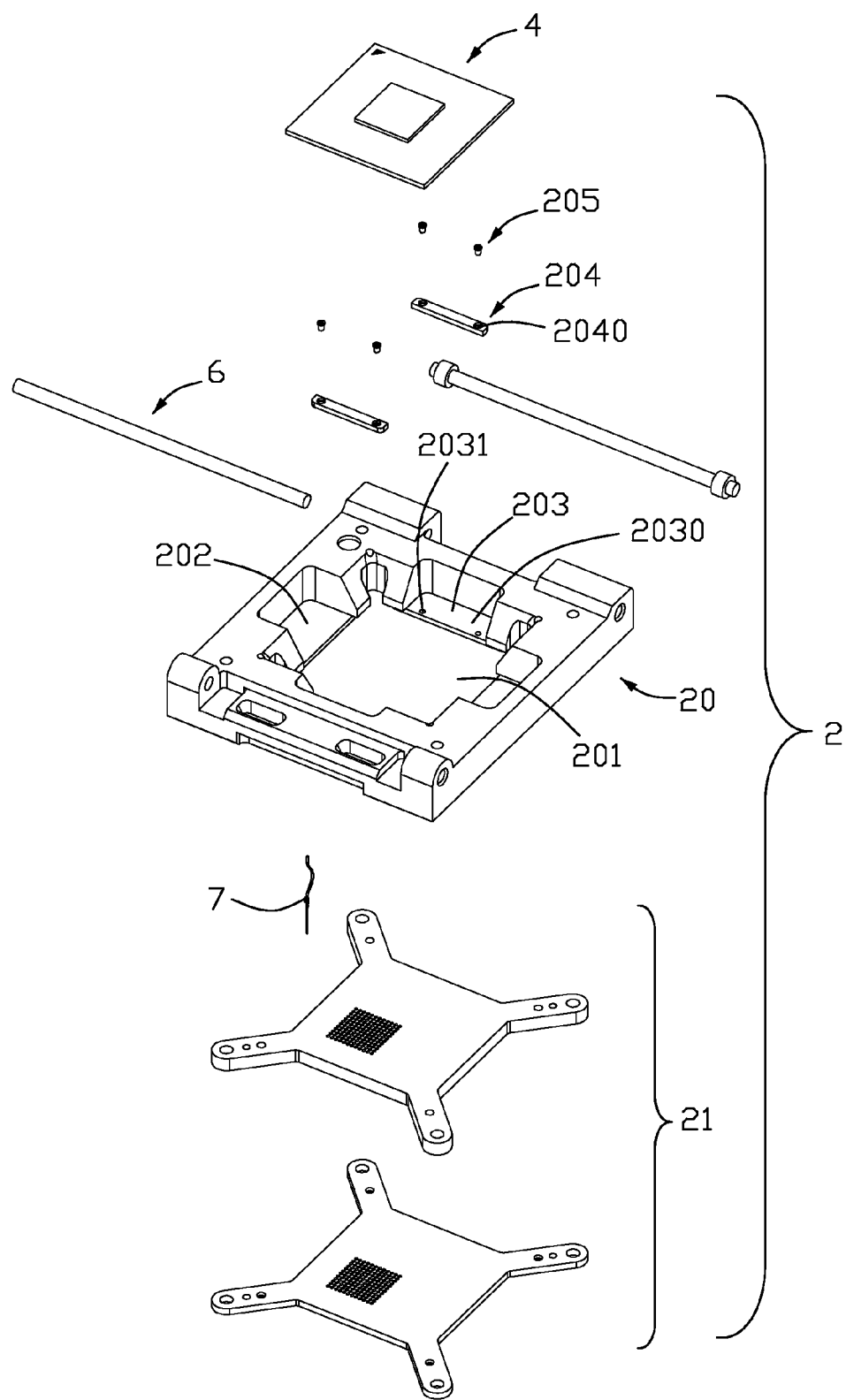
FIG. 3 is a partially exposed perspective view of a base of the burn-in socket according to the present invention.

Referring to FIG. 3, the base 2 includes a rectangular frame 20 and a bottom plate 21 positioned at a bottom of the frame 20. The frame 20 is substantially a rectangular shape and has a receiving space 201 at a center thereof for accommodating the IC package 4. The frame 20 defines two first recesses 202 communicating with the receiving space 201 but not extending through the frame 20 on two opposite walls thereof. The frame 20 further defines two second recesses 203 similar with the first recesses 202 on the other two opposite walls. The first and the second recesses 202, 203 all have bottom walls. A hard stopper 204 is disposed on the bottom wall 2030 of the second recess 203 for engaging with and supporting the cover 3. The hard stopper 204 is made of metal plate or other hard materials. The hard stopper 204 and the bottom wall 2030 of the second recess 203 each define a pair of corresponding screw holes 2040, 2031, a pair of screws 205 pass through the screw holes 2040, 2031 to secure the hard stopper 204 to the bottom wall of the recess 203. The bottom plates 21 are attached to the bottom of the frame 20 and have a plurality of passageways (not labeled) for receiving and securing the contacts 7. The bottom plates 21 can also provide a supporting surface to support the IC package 4.

Figure 2:
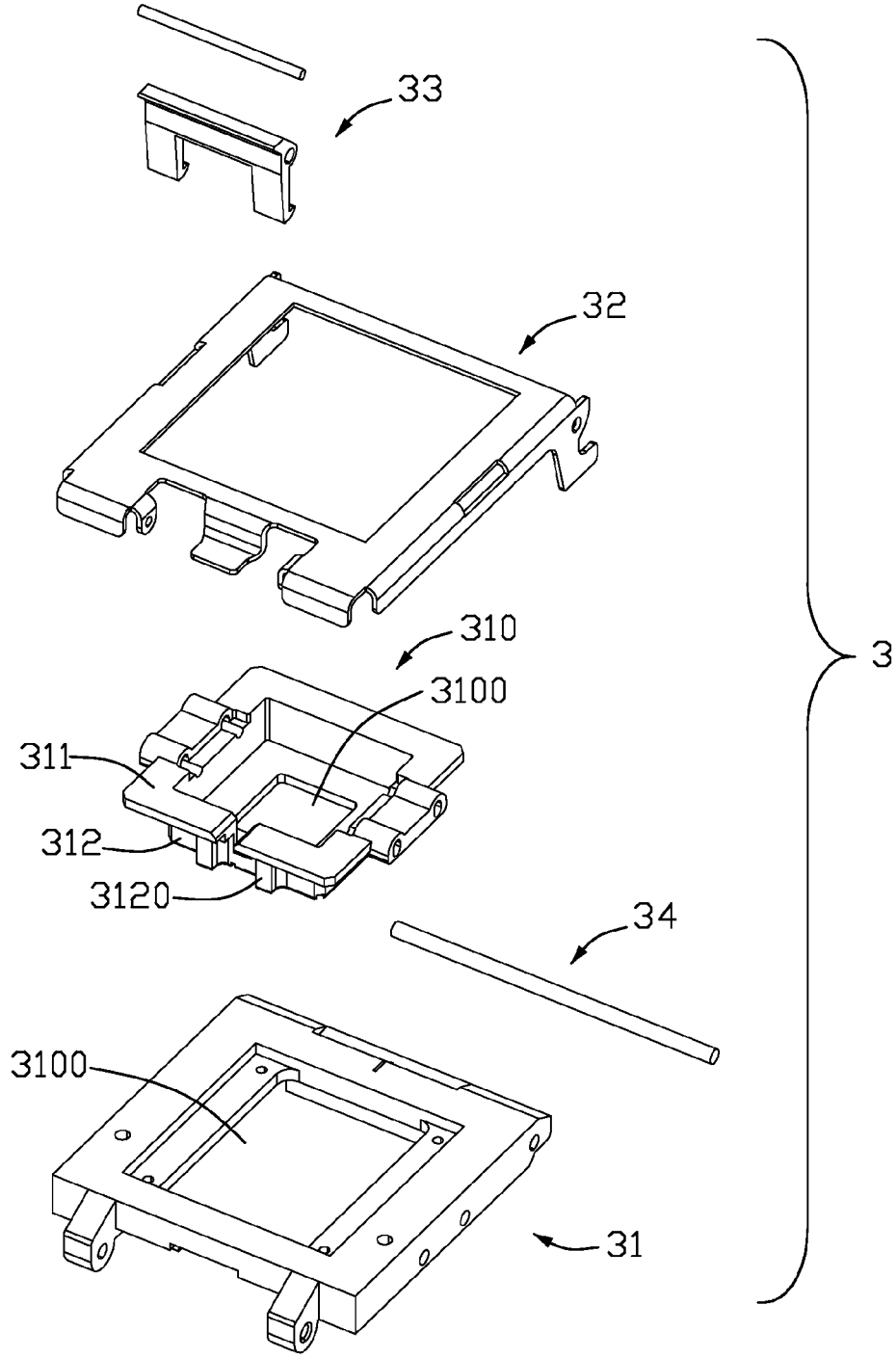
FIG. 2 is a partially exposed perspective view of a cover of the burn-in socket according to the present invention.

Referring to FIG. 2, the cover 3 comprises a lid 31 and a cover plate 32. One end of the lid 31 is pivotally connected to the base 2 by a shaft 6, the other end of the lid 31 is pivotally connected to the cover plate 32 by a rod 34. The lid 31 is formed with a frame configuration for locating a pressing member 310. The lid 31 and the pressing member 310 are connected by bolts (not shown) inserting from a side of the lid 31. Each of the lid 31 and the pressing member 310 has a through hole 3100 for receiving the heat sink 5. The cover plate 32 also has a hole (not labeled) corresponding to the through hole 3100, and the heat sink 5 is assembled to the cover 3 along an up-to-down direction with a contacting surface 50 extending through the through hole 3100. The pressing member 310 comprises a main body 311 and a pressing portion 312 protruding from a bottom of the main body 311. Protrusions 3120 extend from the opposite ends of the pressing portion 312 and touch the hard stoppers 204 in the second recesses 203 when the cover 3 is in the closed position. The cover 3 is attached to the base 2 by a latch 33 mounted to one end of the cover plate 32.

Figure 4:
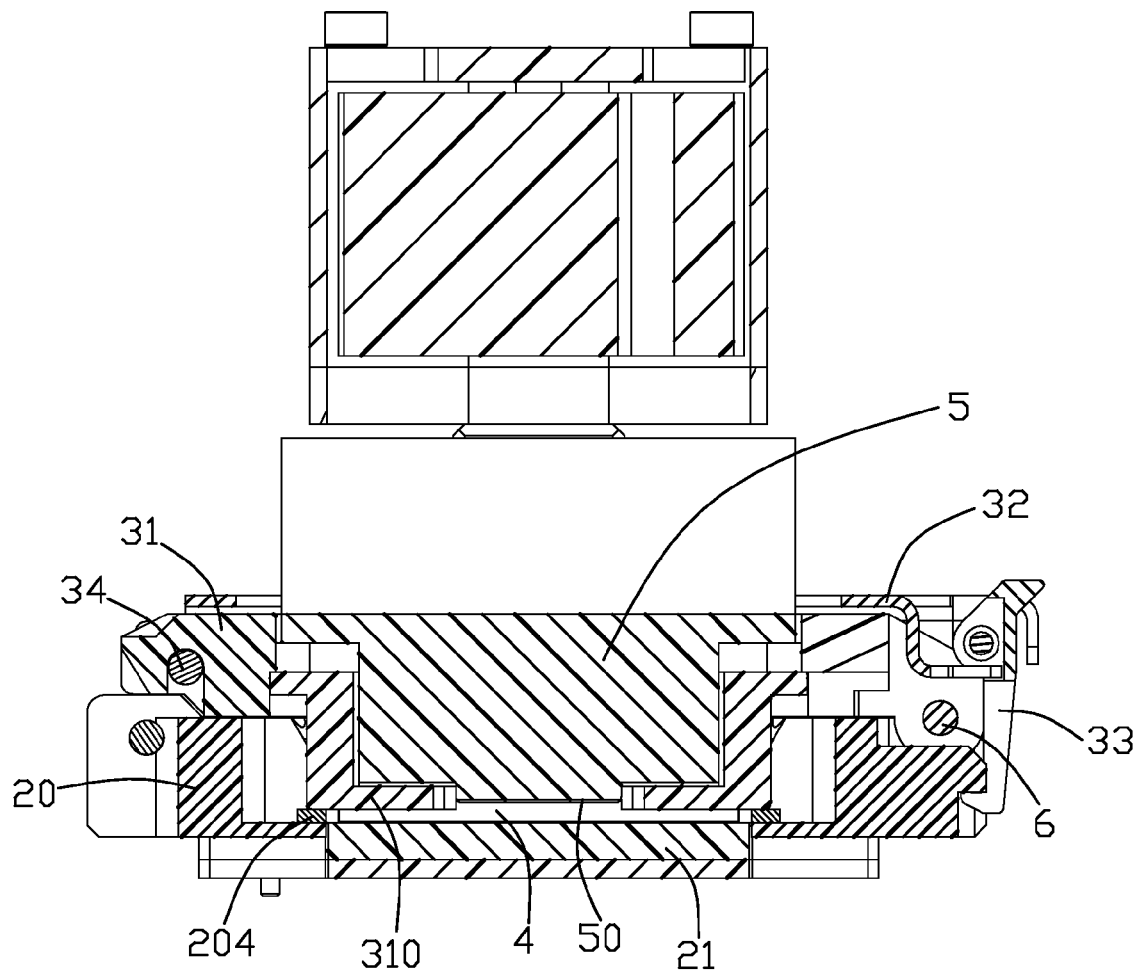
FIG. 4 is a schematic view of the burn-in socket with an IC package thereof, showing the cover at a closed position.

Referring to FIG. 4, the hard stopper 204 in the second recess 203, so that the hard stopper 204 can support the pressing member 310 when the cover 3 is in the closed position. On that situation, a stroke of the contact 7 caused by being pressed by the IC package 4 which is pressed by the pressing member 310 is therefore depended on the hard stopper 204 and the pressing member 310, and the stroke is independent of the whole members of the cover 3. As the members that are utilized to control the stroke of the contacts 7 are reduced, the composite tolerance generated by the members is reduced. Thus the stroke of the contacts 7 can be exactly controlled to avoid over pressing of the contacts 7.

As the burn-in socket may need to receive different thickness of the IC packages or assembled with another bottom plate with different contacts, the present burn-in socket just need to mount another hard stopper with a proper thickness to assure a proper mating of the hard stopper with the cover, and not need to change the cover. As a result, the present burn-in socket has a simple structure and a low cost.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A burn-in socket comprising:
   a base defining a receiving space;
   a plurality of contacts received in the receiving space of the base;
   a cover pivotally mounted to the base and rotatably moving between an open position and a closed position relative to the base; and
   at least one separated hard stopper having screw holes mounted in the base and supporting the cover;
   wherein the cover includes a lid assembled to the base and a cover plate assembled to the lid;
   wherein the lid has a pressing member mounted thereof, the pressing member is located in a center opening of the lid and connects with the lid by a bolt;
   wherein the pressing member comprises a main body and a pressing portion protruding from a bottom of the main body;
   wherein the pressing portion has protrusions from opposite ends thereof to be adapted to touch the hard stoppers when the cover is in the closed position; and
   wherein the hard stopper is a metal plate.

2. The burn-in socket as claimed in claim 1, wherein the base defines a plurality of recesses communicating with the receiving space, the recesses are divided into first recesses on two opposite end walls of the receiving space and second recesses on the other two opposite end walls of the receiving space.

3. The burn-in socket as claimed in claim 2, wherein the burn-in socket has two said hard stoppers, each hard stopper is assembled to a bottom wall of the first recess or the second recess.

4. The burn-in socket as claimed in claim 2, wherein the burn-in socket has a plurality of said hard stoppers, the hard stoppers are assembled to each of recesses by screws.

5. The burn-in socket as claimed in claim 1, wherein the base includes a frame and a bottom plate positioned at a bottom of the frame and having a plurality of passageways for receiving the contacts.

6. The burn-in socket as claimed in claim 1, wherein the cover is attached to the base by a latch mounted to one end of the cover plate.

7. A burn-in socket comprising:
   a base defining a receiving space;
   a plurality of contacts received in the receiving space of the base;
   a cover pivotally mounted to the base and rotatably moving between an open position and a closed position, the cover having a pressing portion extending into the receiving space when the cover set in the closed position, the pressing portion having a plurality of protrusions extending therefrom;
   a separated hard stopper having screw holes mounted in the base adapted to load the protrusion of the cover;
   wherein the cover includes a lid assembled to the base and a cover plate assembled to the lid;
   wherein the lid has a pressing member positioned in an opening of the lid, the pressing member and the lid are connected with by a bolt;
   wherein the pressing member comprises a main body, and the pressing portion is protruding from a bottom of the main body;
   wherein the pressing member has protrusions from opposite ends thereof to be adapted to touch the hard stoppers when the cover is in the closed position; and
   wherein the hard stopper is a metal plate.

* * * * *